(12) United States Patent
Inoue et al.

(10) Patent No.: US 8,002,895 B2
(45) Date of Patent: Aug. 23, 2011

(54) HEAT PROCESSING APPARATUS FOR SEMICONDUCTOR PROCESS

(75) Inventors: Hisashi Inoue, Nirasaki (JP); Atsushi Endo, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 118 days.

(21) Appl. No.: 11/882,605

(22) Filed: Aug. 2, 2007

(65) Prior Publication Data

US 2008/0083372 A1 Apr. 10, 2008

(30) Foreign Application Priority Data

Aug. 4, 2006 (JP) .................................. 2006-213898

(51) Int. Cl.
*C23C 16/00* (2006.01)
(52) U.S. Cl. ............... 118/715; 156/345.33; 156/345.34
(58) Field of Classification Search .................. 118/715, 118/724, 725; 156/345.33, 345.34
See application file for complete search history.

(56) References Cited

U.S. PATENT DOCUMENTS

| | | | | |
|---|---|---|---|---|
| 5,217,560 A | * | 6/1993 | Kurono et al. | 156/345.43 |
| 5,273,424 A | * | 12/1993 | Kobayashi | 432/241 |
| 5,709,757 A | * | 1/1998 | Hatano et al. | 134/22.14 |
| 5,925,188 A | * | 7/1999 | Oh | 118/715 |
| 5,958,140 A | * | 9/1999 | Arami et al. | 118/725 |
| 6,142,773 A | * | 11/2000 | Shimazu | 432/241 |
| 6,444,262 B1 | * | 9/2002 | Kitamura et al. | 427/248.1 |
| 6,807,971 B2 | * | 10/2004 | Saito et al. | 134/22.11 |
| 6,847,015 B2 | * | 1/2005 | Wang et al. | 219/486 |
| 6,881,295 B2 | * | 4/2005 | Nagakura | 156/345.33 |
| 2004/0025786 A1 | * | 2/2004 | Kontani et al. | 118/715 |
| 2004/0094091 A1 | * | 5/2004 | Yang et al. | 118/715 |
| 2004/0099216 A1 | * | 5/2004 | Koh et al. | 118/723 CB |
| 2005/0272271 A1 | * | 12/2005 | Furuya et al. | 438/785 |

FOREIGN PATENT DOCUMENTS

| | | |
|---|---|---|
| CN | 1701133 | 11/2005 |
| JP | 05-070299 | * 3/1993 |
| JP | 5-70299 | 3/1993 |
| JP | 08-186081 | 7/1996 |
| JP | 2000-299287 | 10/2000 |
| JP | 2003-203871 | 7/2003 |
| JP | 2004-260204 | * 9/2004 |

OTHER PUBLICATIONS

Chinese Office Action issued on Nov. 27, 2009 for Chinese Application No. 200710140224.2 with partial English language translation.

* cited by examiner

*Primary Examiner* — Ram N Kackar
*Assistant Examiner* — Satish Chandra
(74) *Attorney, Agent, or Firm* — Smith, Gambrell & Russell, LLP

(57) ABSTRACT

A heat processing apparatus for a semiconductor process includes a reaction tube including a process field configured to store a plurality of target substrates stacked at intervals. A gas supply duct is integrally provided outside the wall of the reaction tube to extend vertically in a range that covers the process field. A plurality of gas delivery holes are formed in the side portion of the wall of the reaction tube, to be vertically arrayed in a range that covers the process field and communicate with the gas supply duct. A gas supply system is connected to a bottom portion of the gas supply duct to supply a process gas to the process field through the gas supply duct and the plurality of gas delivery holes.

7 Claims, 13 Drawing Sheets

HEAT PROCESSING APPARATUS FOR SEMICONDUCTOR PROCESS

BACKGROUND OF THE INVENTION

1. Field of the Invention

The present invention relates to a heat processing apparatus for a semiconductor process for forming a film on a target substrate such as a semiconductor wafer. The semiconductor process refers to various types of processes which are performed to form a semiconductor layer, an insulating layer, a conductive layer, or the like in a predetermined pattern on a target substrate such as a semiconductor wafer or a glass substrate for an FPD (Flat Panel Display), such as an LCD (Liquid Crystal Display), thereby manufacturing a structure including a semiconductor device, a wiring line connected to the semiconductor device, an electrode, or the like on the target substrate.

2. Description of the Related Art

Examples of a semiconductor manufacturing apparatus include a batch type heat processing apparatus such as a vertical furnace or a horizontal furnace. A vertical heat processing apparatus (vertical furnace) is an apparatus in which a wafer boat which holds a large number of target substrates is loaded in a vertical reaction tube and heated. An example of the heat process performed by a heat processing apparatus of this type includes a film formation process by a CVD process at a low pressure.

When performing low-pressure CVD, a method of supplying a film formation gas from the lower portion of a reaction tube and exhausting the gas from its upper portion is conventionally employed. With this method, however, the gas concentration in the upper portion of the reaction tube decreases, and variations in film thicknesses of target substrates in the vertical direction increase. To improve the uniformity of the film thickness (the decomposition amount of the film formation gas in the reaction tube in the vertical direction) among the target substrates, the process field in the reaction tube is vertically divided into zones. Heaters are also divided to correspond to the respective zones. Then, zone control can be performed independently among the zones such that a temperature gradient is formed in the reaction tube.

Some of recent processes may require to eliminate or minimize the temperature gradient among the target substrates. An example of such a process includes one which forms a silicon nitride film (SiN film) to be disposed on a certain portion of a semiconductor device.

According to a CVD process that forms an SiN film, for example, $SiH_2Cl_2$ (dichlorosilane) gas and $NH_3$ (ammonia) gas are supplied into the reaction tube. In this case, in order to decrease variations in concentration distribution of the process gases in the reaction tube, there is known a technique in which a large number of holes are formed in a gas nozzle in the reaction tube and a process gas is supplied through the respective holes, as described in, e.g., Patent Document 1 (see Jpn. Pat. Appln. KOKAI Publication No. 2004-260204 ((0014), FIG. 2)). In this case, however, in order to decrease the pressure (flow rate) gradient in the vertical direction of the process gas supplied from the holes of the gas nozzle, the gas pressure in the gas nozzle must be increased. Also, in this case, as the opening diameters of the holes become as very small as, e.g., 1 mm or less, a product generated by the reaction of the process gas tends to deposit on the opening edges of the holes during the heat process of the target substrates. This may change the hole diameters. If the uniformity in gas flow rate among the holes is lost, it becomes difficult to form films with high uniformity among the target substrates. Furthermore, the product deposited in the holes may be dropped by the pressure of the process gas and cause particle contamination. Therefore, cleaning must be performed frequently.

For example, when the opening diameters of the holes of the gas nozzle are increased, the gas flow velocity may become low and variations in gas flow velocity may decrease. In order to achieve this, the pipe diameter of the gas nozzle must be increased, and the pressure gradient in the gas nozzle in the vertical direction must be decreased (the pressure must be decreased). Consequently, the gap between the reaction tube and the target substrates increases, and the planar uniformity of the film thickness degrades.

Jpn. Pat. Appln. KOKAI Publication No. 2003-203871 ((0010), FIG. 1) describes a technique to solve this problem, in which the wall surface of a reaction tube is projected outwardly only at a part where a gas nozzle is to be installed, so that the gap between the inner wall of the reaction tube and target substrates decreases. However, as the distance between the wall surface of the reaction tube and the outer surfaces of the target substrates is not constant, the planar uniformity of the film thickness degrades. Also, because the pressure resistance of the reaction tube decreases, the reaction tube must have a double structure. In this case, the cleaning time in the reaction tube prolongs, and the apparatus becomes bulky.

A technique is also known in which gas supply pipes with different heights are arranged in the reaction tube so as to decrease variations in concentration of the process gas. However, this technique requires, e.g., five or more gas supply pipes, undesirably leading to a large-scale process gas supply facility.

Jpn. Pat. Appln. KOKAI Publication No. 2000-299287 ((0023), FIG. 15) describes a heat processing apparatus in which a path forming member is provided outside a reaction tube and a gas is supplied into the reaction tube through the path forming member. When the gas flow rate is small (an amount used for an ordinary heat process), however, a flow rate gradient in gas is formed in each slit. As the gap between the reaction tube and target substrates is not constant, the planar uniformity of the film thickness degrades.

Jpn. Pat. Appln. KOKAI Publication No. 8-186081 ((0044), FIG. 11) describes a heat processing apparatus in which an exhaust port is formed at a portion opposing a gas supply region, and a horizontal gas flow is formed. As the side wall of the reaction tube projects outwardly to form the exhaust port, the planar uniformity of the film thickness also degrades.

BRIEF SUMMARY OF THE INVENTION

An object of the present invention is to provide a heat processing apparatus for a semiconductor process in which the gap between the inner wall of a reaction tube and target substrates is decreased and the planar uniformity of the film thickness can be improved.

Another object of the present invention is to provide a heat processing apparatus for a semiconductor process which can be installed and maintained easily.

According to a first aspect of the present invention, there is provided a heat processing apparatus for a semiconductor process, comprising: a reaction tube including a process field configured to store a plurality of target substrates stacked at intervals; a support member configured to support the target substrates in the process field; an exhaust system configured to exhaust an interior of the process field; a heater configured to heat the target substrates in the process field; a gas supply duct integrally provided outside a wall of the reaction tube and extending vertically; a gas delivery opening formed in the wall of the reaction tube and communicating with the gas supply duct; and a gas supply system connected to a bottom portion of the gas supply duct to supply a process gas to the process field through the gas supply duct and the gas delivery opening, wherein the reaction tube includes a transfer port, in a bottom portion thereof, through which the support member is loaded/unloaded, and a flange integrally formed with the reaction tube that surrounds the transfer port, and disposed to engage with a lid which opens/closes the transfer port, and wherein the bottom portion of the gas supply port is defined by an upper surface of the flange, and a gas flow channel which introduces the process gas from the gas supply system into the gas supply duct is formed in the flange.

According to a second aspect of the present invention, there is provided a heat processing apparatus for a semiconductor process, comprising: a reaction tube including a process field configured to store a plurality of target substrates stacked at intervals; a support member configured to support the target substrates in the process field; an exhaust system configured to exhaust an interior of the process field; a heater configured to heat the target substrates in the process field; a gas supply duct integrally provided outside a wall of the reaction tube and extending vertically in a range that covers the process field; a plurality of gas delivery holes formed in a side portion of the wall of the reaction tube, vertically arrayed in a range that covers the process field, and communicating with the gas supply duct; and a gas supply system connected to a bottom portion of the gas supply duct to supply a process gas to the process field through the gas supply duct and said plurality of gas delivery holes.

According to a third aspect of the present invention, there is provided a heat processing apparatus for a semiconductor process, comprising: a reaction tube including a process field configured to store a plurality of target substrates stacked at intervals; a support member configured to support the target substrates in the process field; an exhaust system configured to exhaust an interior of the process field; a heater configured to heat the target substrates in the process field; a gas supply duct integrally provided outside a wall of the reaction tube and extending from a bottom portion to a top portion of the reaction tube; a gas delivery hole formed in a top portion of the wall of the reaction tube and communicating with the gas supply duct; and a gas supply system connected to a bottom portion of the gas supply duct to supply a process gas to the process field through the gas supply duct and the gas delivery hole.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Figure 1:
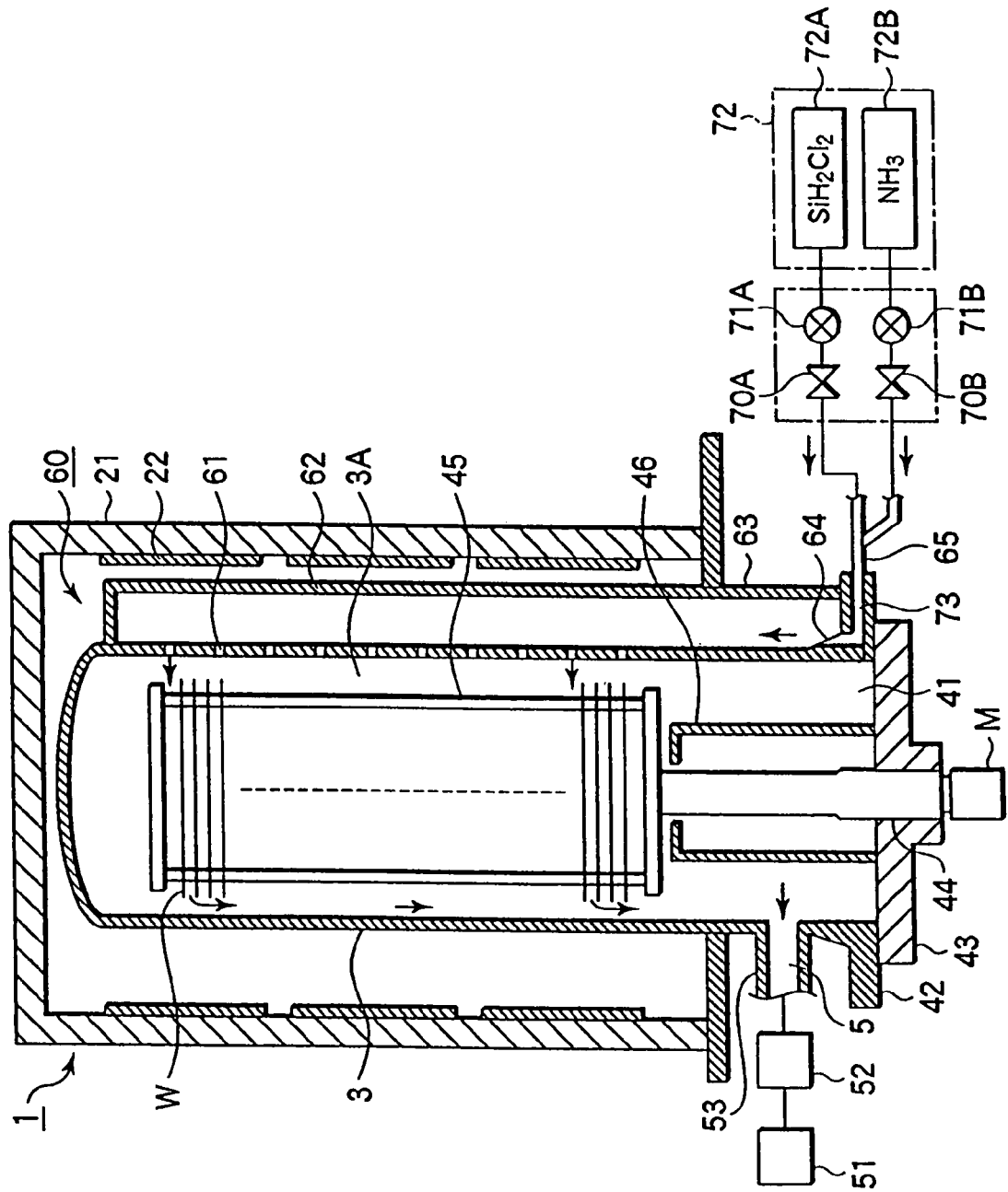
FIG. 1 is a sectional side view showing the overall arrangement of a heat processing apparatus for a semiconductor process according to the first embodiment of the present invention.

The embodiments of the present invention will be described with reference to the drawings. In the following description, constituent elements having almost the same functions and arrangements are denoted by the same reference numerals, and a repetitive explanation will be made only where necessary.

First Embodiment

FIG. 1 is a sectional side view showing the overall arrangement of a heat processing apparatus for a semiconductor process according to the first embodiment of the present invention. This heat processing apparatus 1 has a cylindrical reaction tube 3 made of a heat-resistant insulating material, e.g., quartz, and having a circular section. The reaction tube 3 includes a process field 3A where semiconductor wafers W stacked at intervals are to be stored. The reaction tube 3 has an opening 41, serving as a transfer port, at its proximal end side (lower end side). A flange 42 integral with the reaction tube 3 is formed on the edge portion of the opening 41. The flange 42 engages with a lid 43 vertically moved by a boat elevator (not shown), so that the opening 41 can be hermetically closed.

A cylindrical cover 21 made of, e.g., a heat insulating material, surrounds the reaction tube 3. A plurality of heaters 22 are disposed along the inner wall surface of the cylindrical cover 21 in the circumferential direction. The heaters 22 are vertically divided into portions, e.g., three in this case for the sake of convenience. By temperature-controlling the respective heaters 22 independently of each other, the process field 3A in the reaction tube 3 can be temperature-controlled divisionally in the respective zones. As the heaters 22, for examples, those formed by sealing carbon wire heaters, formed by knitting, e.g., a plurality of high-purity carbon fiber bundles in a ceramic material, can be used. The heaters 22 are not limited to such heaters, but metal bodies made of, e.g., an iron-chrome-nickel alloy, can be used.

A wafer boat 45 serving as a holding tool for holding, e.g., 100 wafers W like shelves, is disposed on the lid 43. When the lid 43 vertically moves, the wafer boat 45 is loaded in and unloaded from the reaction tube 3. A heat insulating unit 46 and a rotary shaft 44 extending through the lid 43 are disposed under the wafer boat 45. A motor M serving as a driving unit and attached to the boat elevator (not shown) rotates the rotary shaft 44. Accordingly, when the motor M rotates, the wafer boat 45 rotates together with the rotary shaft 44.

An exhaust port 5 for exhausting the interior of the reaction tube 3 is formed in the side surface of the reaction tube 3, on the opening 41 side which is the proximal end side. An exhaust means 51, e.g., a vacuum pump, which can reduce the pressure in the reaction tube 3 is connected to the exhaust port 5 through an exhaust pipe 53 provided with a pressure regulator 52 comprising, e.g., a butterfly valve. Although the exhaust port 5 is formed on the proximal end side of the reaction tube 3 in this case, the exhaust port 5 may be formed on the distal end side (upper end side). It suffices the exhaust port 5 formed on either side (one end side) of the reaction tube 3.

Figure 2:
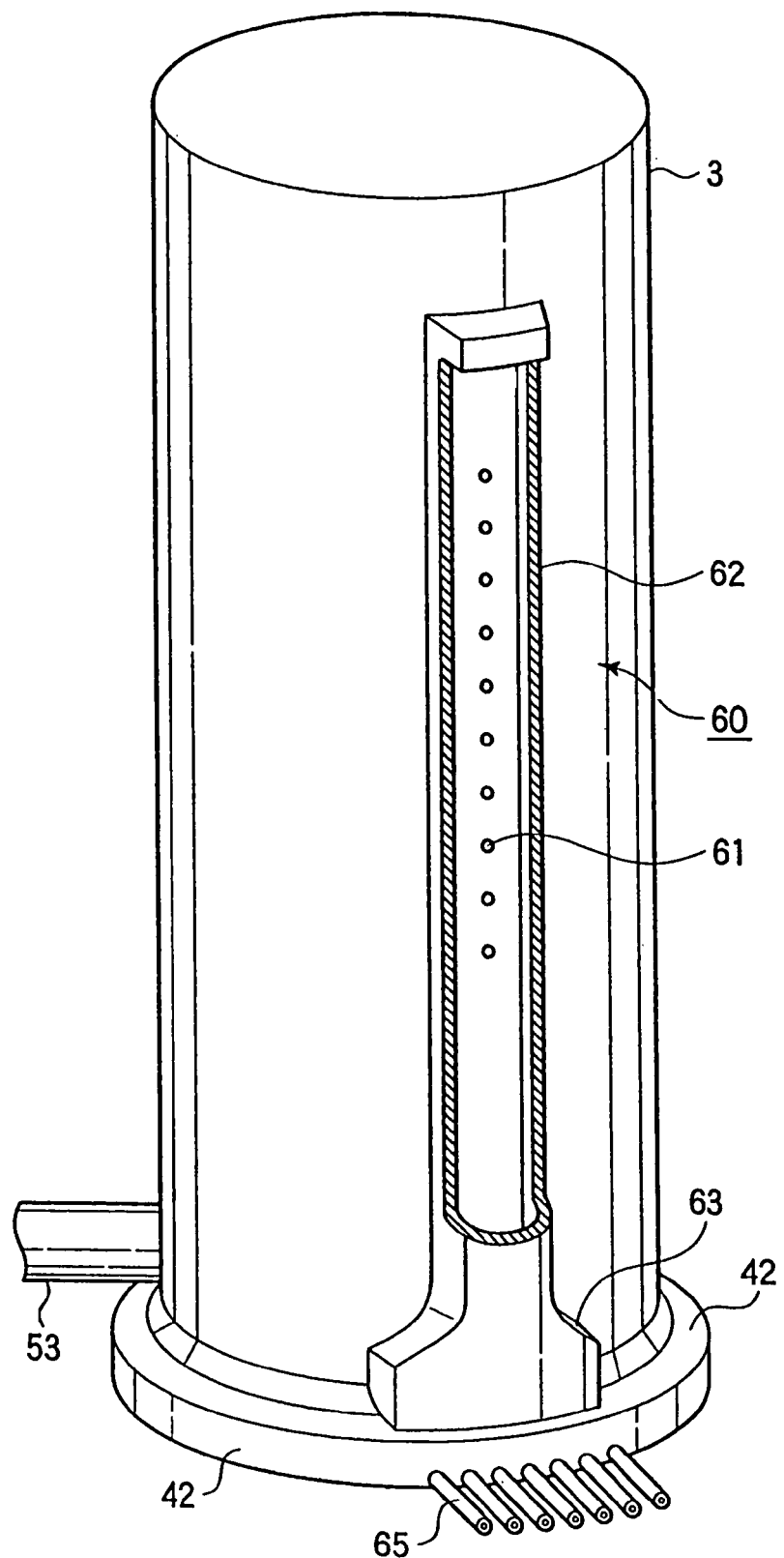
FIG. 2 is a partially cutaway perspective view showing a reaction tube and a gas supply duct in the heat processing apparatus in FIG. 1.
Figure 3:
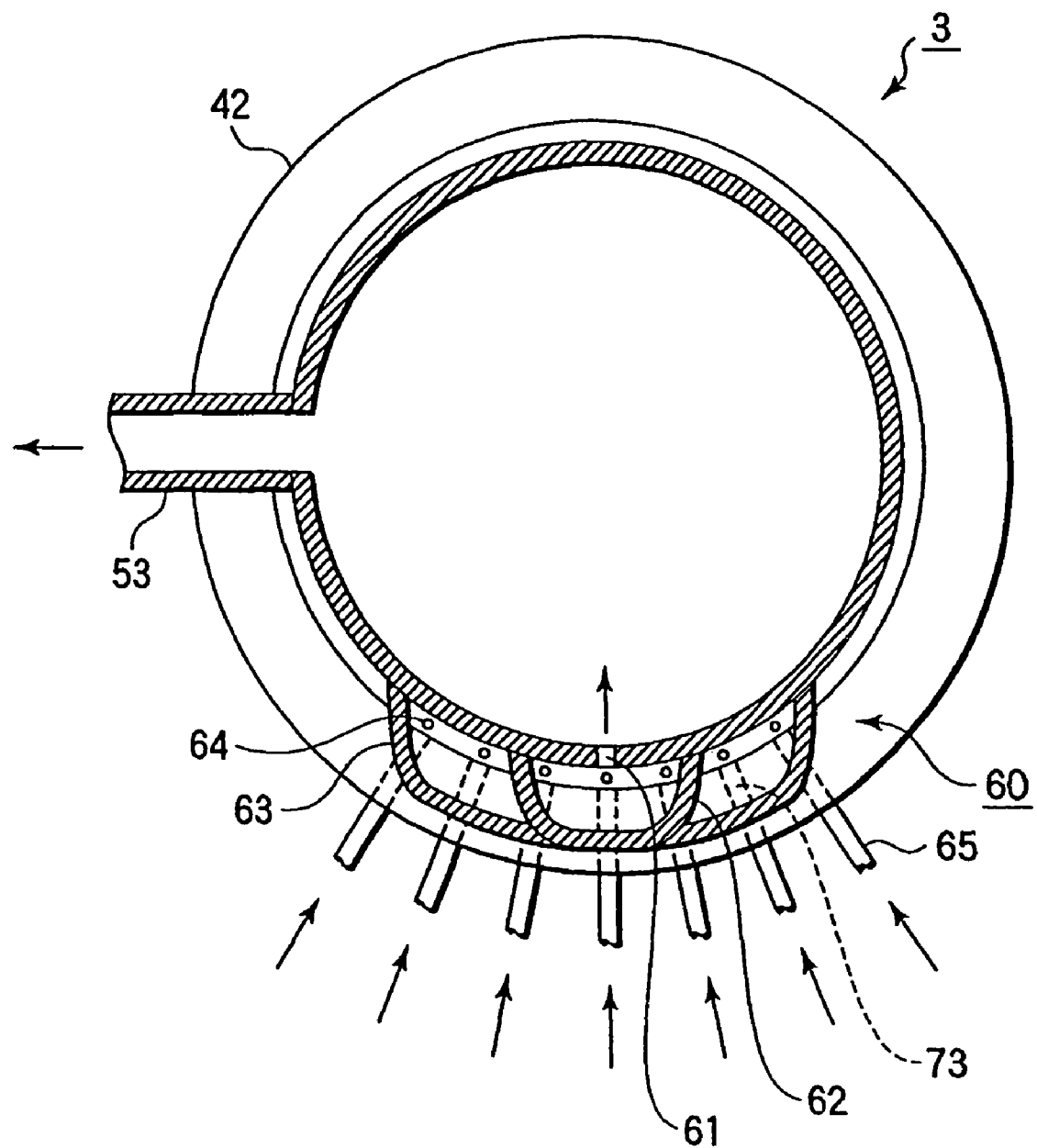
FIG. 3 is a sectional plan view showing the reaction tube and gas supply duct in the heat processing apparatus in FIG. 1.

A gas supply duct 60, serving as a gas supply path for supplying a gas into the reaction tube 3, is integrally disposed on the outer wall of the reaction tube 3. The gas supply duct 60 is made of the same heat insulating material, e.g., quartz, as that of the reaction tube 3. The gas supply duct 60 forms a flat, vertically long box, and extends along the outer surface of the side wall of the reaction tube 3 in the longitudinal direction in a range that covers the process field 3A. FIGS. 2 and 3 are a partially cutaway perspective view and a sectional plan view, respectively, showing the reaction tube 3 and gas supply duct 60 in the heat processing apparatus 1. As shown in FIG. 2, the gas supply duct 60 comprises a vertically long portion 62 and an enlarged portion (manifold portion) 63. The vertically long portion 62 forms an almost rectangular parallelepiped. The enlarged portion 63 extends wide from the lower end of the vertically long portion 62. One surface of the gas supply duct 60 is open. The open edge of the opening of the gas supply duct 60 is melted and adhered, i.e., welded, to the outer surface of the reaction tube 3. Therefore, that wall portion of the reaction tube 3 which corresponds to the inner side of the gas supply duct 60 also serves as the wall of the gas supply duct 60. The flange 42 at the bottom portion of the reaction tube 3 defines the bottom portion of the gas supply duct 60.

A plurality of gas delivery holes 61 are formed in the side wall of the reaction tube 3 such that they line up in the vertical direction. The gas delivery holes 61 correspond to the vertically long portion 62 of the gas supply duct 60. The gas supply duct 60 communicates with the process field 3A through the gas delivery holes 61. The gas delivery holes 61 have a diameter of, e.g., 10 mm, and are formed at portions, e.g., 10 portions, at almost regular intervals within a range that covers the process field 3A. In other words, the gas delivery holes 61 are formed in order that the gas is supplied to the entire process field 3A in the reaction tube 3, where the semiconductor wafers W are held, such that variations in the flow rate of the gas are suppressed. Although the gas delivery holes 61 are arranged in one vertical column in this embodiment, they may be arranged to form a plurality of columns, e.g., two columns.

Figure 4:
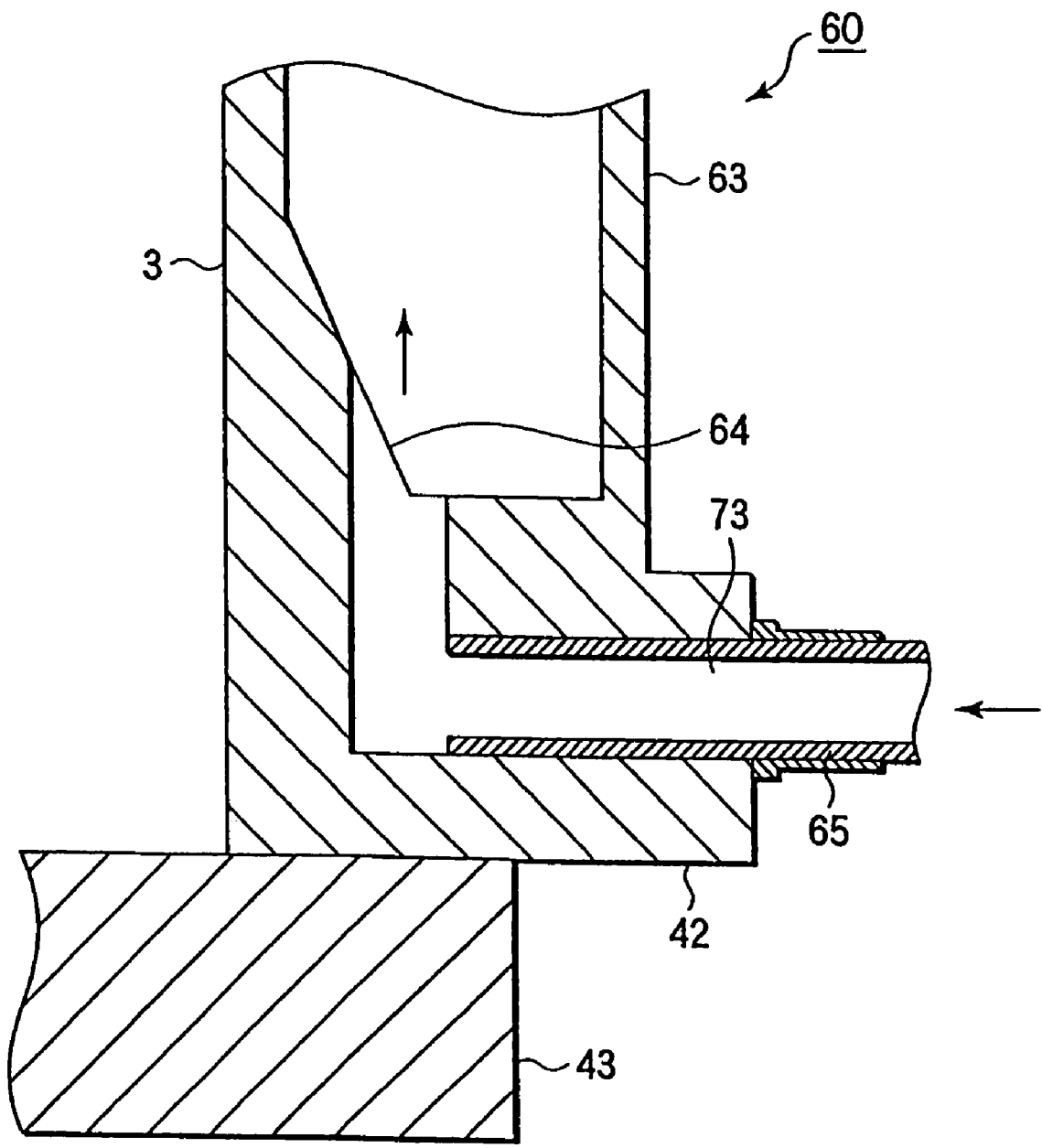
FIG. 4 is a sectional side view showing the relationship between the bottom portion of the gas supply duct and the flange of the reaction tube in the heat processing apparatus in FIG. 1.

FIG. 4 is a sectional side view showing the relationship between the bottom portion of the gas supply duct and the flange 42 of the reaction tube 3. As shown in FIG. 4, for example, seven gas flow channels 73 are formed in the flange 42 in the circumferential direction. The distal ends of the respective gas flow channels 73 are connected to the inside of the enlarged portion 63 at the root portion of the flange 42 through gas introduction ports 64. Seven gas supply pipes 65 are respectively connected to the proximal ends of the gas flow channels 73 to communicate with the gas introduction ports 64. In more detail, for example, the distal end portions of the gas supply pipes 65 are inserted in the gas flow channels 73 from the outside. The gas supply pipes 65 and ports formed in the outer end faces of the flange 42 are hermetically sealed. In this specification, the gas passing portions in the flange 42 are referred to as the gas flow channels 73. According to this arrangement, each gas supply pipe 65 in the flange 42 forms part of the corresponding gas flow channel 73.

The seven gas supply pipes 65 are respectively connected to different gas supply sources. This allows formation of different types of films, and cleaning. For example, one gas supply pipe 65 is connected to an $SiH_2Cl_2$ (dichlorosilane) gas source 72A through a valve 70A and a flow controller 71A. Another gas supply pipe 65 is connected to an $NH_3$ (ammonia) gas source 72B through a valve 70B and a flow controller 71B. Still another gas supply pipe 65 is connected to, e.g., a cleaning gas source (not shown). The $SiH_2Cl_2$ (dichlorosilane) gas source 72A and $NH_3$ gas source 72B constitute a gas source section 72.

An example of a heat processing method which employs the above heat processing apparatus 1 will be described concerning a case of forming an SiN film on the surface of a silicon wafer (to be referred to as a "wafer W" hereinafter) by CVD.

First, for example, 100 wafers W are held by the wafer boat 45, and the wafer boat 45 is loaded in the reaction tube 3 using the boat elevator (not shown). After that, the lid 43 is moved upward. This hermetically closes the reaction tube 3. The exhaust means 51 reduces the pressure in the reaction tube 3 to, e.g., 27 Pa (0.2 Torr). The heaters 22 heat the interior of the reaction tube 3 to a preset process temperature, e.g., 650 C°. Then, the valves 70A and 70B are opened. $SiH_2Cl_2$ gas and $NH_3$ gas as process gases are supplied from the gas sources 72A and 72B. The process gases are introduced via the gas supply pipes 65 and the gas flow channels 73 in the flange 42 to the enlarged portion 63 of the gas supply duct 60 through the gas introduction ports 64 in the upper surface of the flange 42.

The process gases flow upward in the vertically long portion 62 through the exhaust pipe 53 while being heated. During this period of time, the process gases flow into the reaction tube 3 through the gas delivery holes 61, and are supplied to the respective wafers W on the wafer boat 45 which is rotated by the motor M as described above. The process gases react on the surfaces of the wafers W and form SiN films. The exhaust means 51 exhausts unreacted process gases and a gas containing byproducts through the exhaust port 5 in the lower portion of the reaction tube 3. The process gases described above are diluted by, e.g., $N_2$ gas, and a description relating to this will be omitted for the sake of convenience.

According to the above embodiment, the gas supply duct 60 is disposed outside the reaction tube 3. This can reduce the gap between the reaction tube 3 and wafers W, so that the wafers W can undergo a heat process with high planar uniformity. As the gas supply duct 60 is disposed outside the reaction tube 3, the capacity of the gas supply duct 60 can be increased without enlarging the gap between the reaction tube 3 and wafers W. This lowers the pressure of the process gases in the gas supply duct 60 and decreases the pressure gradient in the vertical direction. This can consequently increase the opening diameters of the gas delivery holes 61 without increasing the variations in flow rate of the process gases supplied into the reaction tube 3 through the respective gas delivery holes 61. In this case, it is realized to decrease a change over time of the flow rate of the process gases (the rate of decrease of the opening diameters of the gas delivery holes 61) which occurs as the reaction products of the process gases are deposited in the openings of the gas delivery holes 61. Hence, the heat process can take place stably over a long period of time. Simultaneously, a low pressure atmosphere is generated where the reaction products ($Si_3N_4$, $NH_4Cl$, or the like) of the process gases do not deposit easily, and deposition of the product in the gas supply duct 60 and gas delivery holes 61 decreases. As a result, generation of particles can be suppressed.

The variations in flow rate (flow velocity) of the process gases to be supplied into the reaction tube 3 differ as follows between a case where the gas supply duct 60 described above is used and a case where a conventional gas nozzle (injector) is used. More specifically, with the conventional gas nozzle, if the pressure gradient in the vertical direction is to be moderated, as described above, the diameters of the gas delivery holes 61 must be as small as, e.g., less than 1 mm. In this case, the unevenness of the so-called flow velocity becomes large between a portion where the gas delivery holes 61 are present and a portion where they are not. For this reason, the gas delivery holes 61 must be formed to correspond to the respective wafers W, leading to a large number of gas delivery holes 61.

Figure 5A:
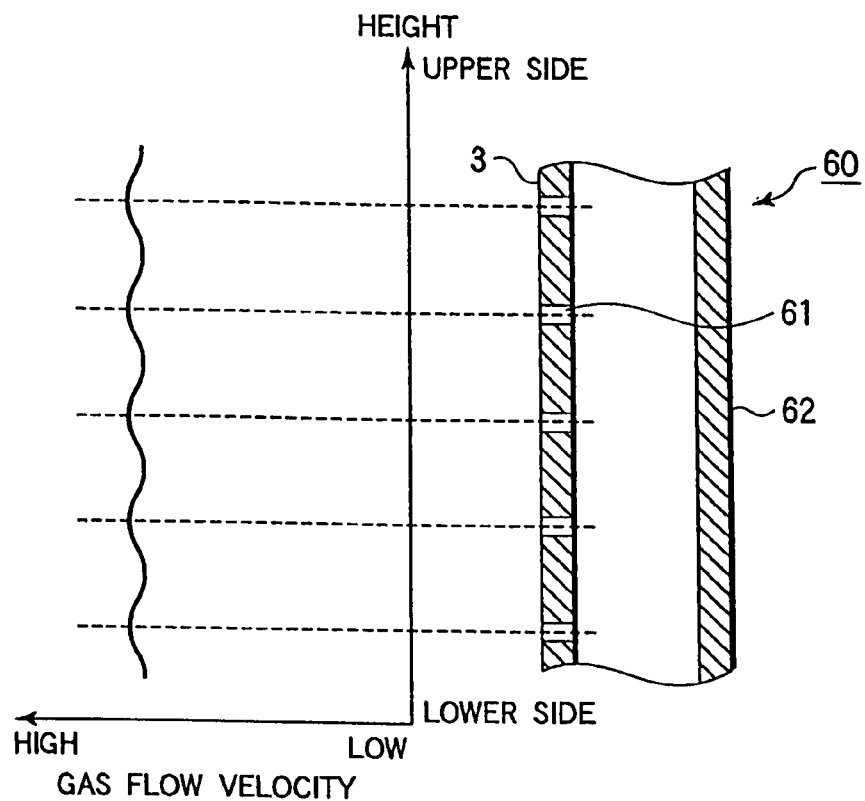
FIGS. 5A and 5B are views each for explaining the distribution of a process gas in the reaction tube.

In contrast to this, with the gas supply duct 60, the opening diameters of the gas delivery holes 61 can be increased to, e.g., 10 mm, as shown in FIG. 5A. Hence, the unevenness of the flow velocity becomes small, and the number of gas delivery holes 61 can accordingly be decreased. This facilitates formation of the gas delivery holes 61. To further ensure the uniformity of the gas flow rate in the vertical direction, preferably, the gas delivery holes 61 at a higher position have larger diameters. With the gas supply duct 60, such subtle machining can be performed easily.

Also, the sectional area of the gas supply duct 60 in the horizontal direction is larger than the sectional area of each gas flow channel 73. Particularly, the lower portion of the gas supply duct 60 where the gas introduction ports 64 are formed is formed as the enlarged portion (manifold portion) 63. Thus, the pressure of a process gas supplied into the gas supply duct 60 becomes lower than the pressure in any gas flow channel 73. In this case, the process gas does not flow back to the gas flow channels 73 easily, and the amount of reaction products attached to the gas flow channels 73 and the pipe walls of the gas supply pipes 65 decreases. This can also suppress generation of particles.

Also, the gas supply duct 60 is integrally disposed on the outer surface of the side wall of the reaction tube 3. In addition, in this embodiment, the gas supply duct 60 vertically stands on the flange 42, and the process gases are introduced into the gas supply duct 60 from the gas flow channels 73 in the flange 42. In this case, the gas supply system can be assembled by installing the reaction tube 3 and connecting pipes to the gas flow channels 73 from the outside. This facilitates installation and maintenance of the heat processing apparatus 1. The interior of the reaction tube 3 and that of the gas supply duct 60 can be cleaned together, leading to easy cleaning operation. As the box-shaped quartz member is welded to the outer surface of the reaction tube 3, the gas supply duct 60 can be formed simply.

The heat processing apparatus 1 can be employed to form not only the SiN film but also, e.g., a polysilicon film, a film doped with a p-type or n-type impurity, e.g., a phosphorus-doped polysilicon film. When forming a doped film, for example, silane gas can be supplied into the reaction tube 3 from the bottom portion of the reaction tube 3, and phosphine gas may be supplied using the gas supply duct 60, so that the uniformity of the dose can be improved within the surface of each wafer W and among the wafers W.

Second Embodiment

Figure 6:
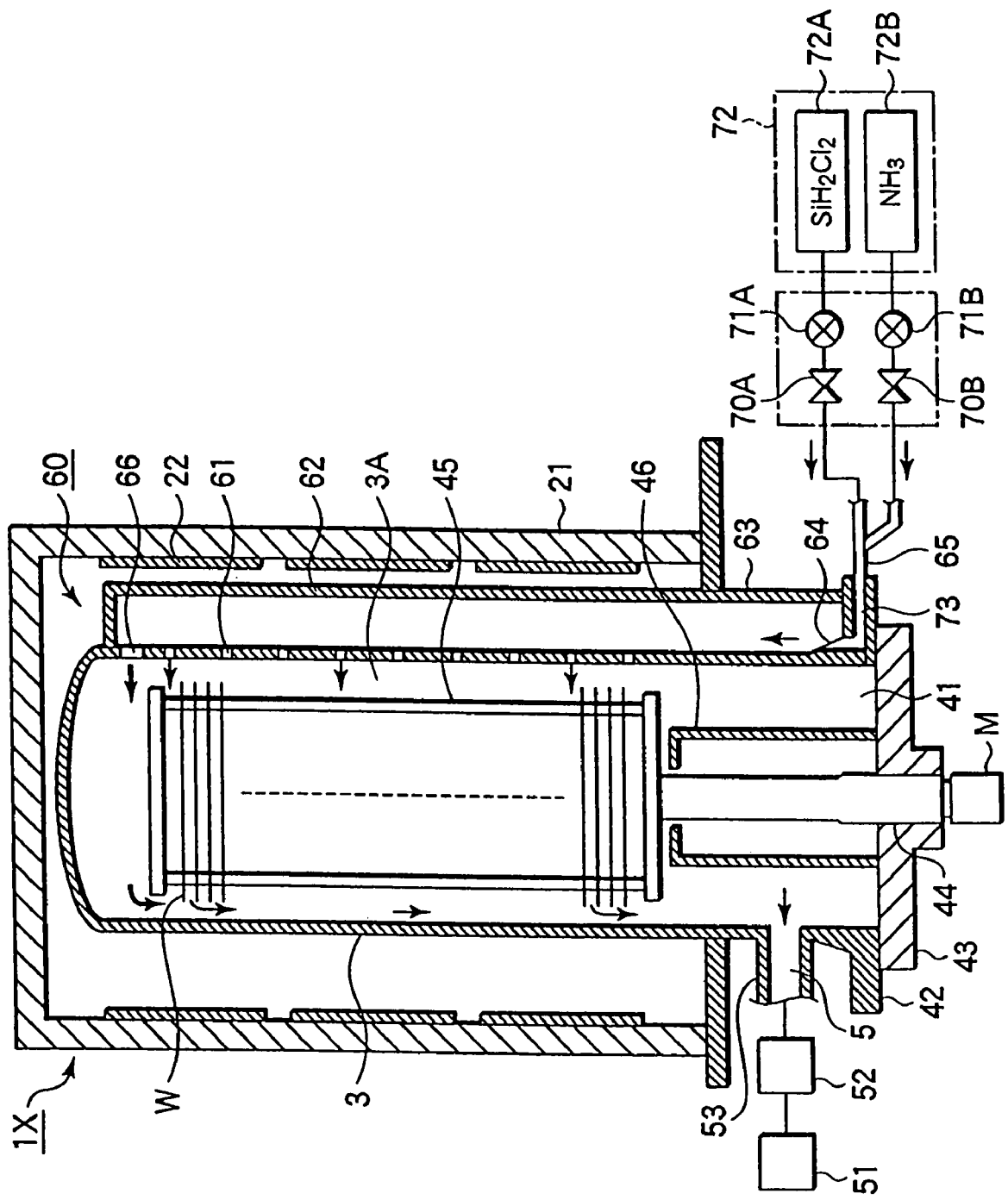
FIG. 6 is a sectional side view showing the overall arrangement of a heat processing apparatus for a semiconductor process according to the second embodiment of the present invention.
Figure 7:
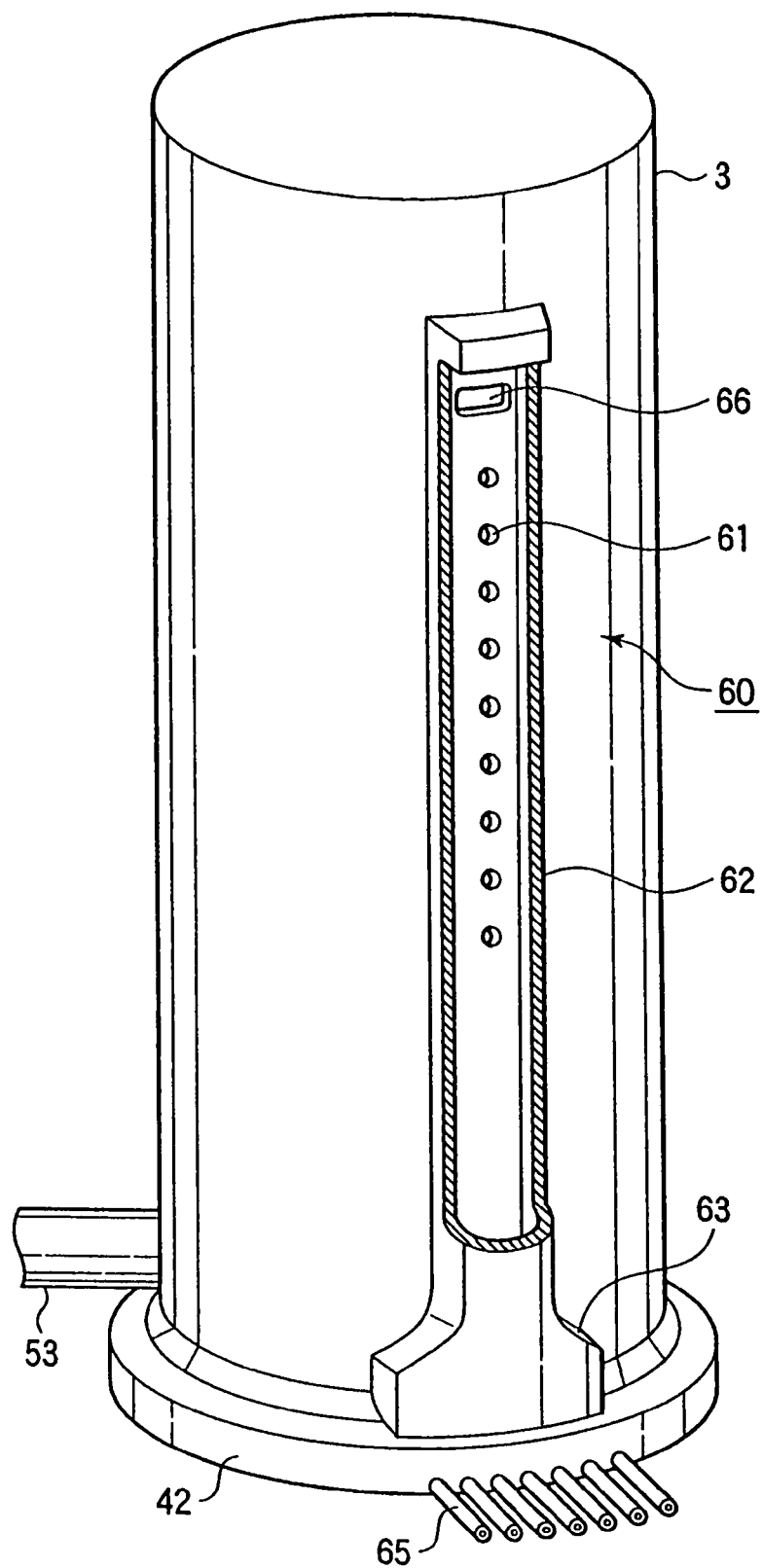
FIG. 7 is a partially cutaway perspective view showing a reaction tube and a gas supply duct in the heat processing apparatus in FIG. 6.

FIG. 6 is a sectional side view showing the overall arrangement of a heat processing apparatus for a semiconductor process according to the second embodiment of the present invention. FIG. 7 is a partially cutaway perspective view showing a reaction tube and a gas supply duct in the heat processing apparatus in FIG. 6. In this heat processing apparatus 1X, a gas supply duct 60 and gas delivery holes 61 are arranged in the same manner as in the heat processing apparatus 1 of the first embodiment. Above the uppermost gas delivery hole 61 in the gas supply duct 60 and above a process field 3A, a pressure equalization hole 66 communicating with the interior of a reaction tube 3 is formed. The pressure equalization hole 66 is formed so that process gases are supplied to a portion above a process field in the reaction tube 3 where wafers W are held. The pressure equalization hole 66 has an opening area larger than that of each gas delivery hole 61, and forms a substantially rectangular shape with a size of approximately 22 mm in length×35 mm in width, as shown in, e.g., FIG. 7. The gas delivery holes 61 are formed such that those on the upper side have larger diameters.

With this arrangement, for example, approximately half the process gases flows via the pressure equalization hole 66 and above the process field 3A for the wafers W in the reaction tube 3, and is exhausted through the gas delivery holes 61 together with the remaining process gases that have flown through the process field 3A for the wafers W. Namely, the flow rate of process gases supplied into the reaction tube 3 through the pressure equalization hole 66 is much larger than that of process gases supplied into the reaction tube 3 through the gas delivery holes 61. In this case, the pressures that the respective gas delivery holes 61 receive from the process gases flowing in the gas supply duct 60 toward the upper pressure equalization hole 66 are uniformed. This allows formation of the gas delivery holes 61 with opening diameters larger than those of the gas delivery holes 61 of the first embodiment described above, e.g., approximately 15 mm, without increasing the variations in pressure distribution of the process gases in the gas supply duct 60 in the vertical direction. The process gases supplied into the reaction tube 3 from the gas delivery holes 61 react on the wafers W, as described above, thus contributing to film formation. The process gases supplied into the reaction tube 3 from the pressure equalization hole 66 are exhausted from an exhaust port 5 by an exhaust means 51 without contributing to film formation.

Figure 5B:
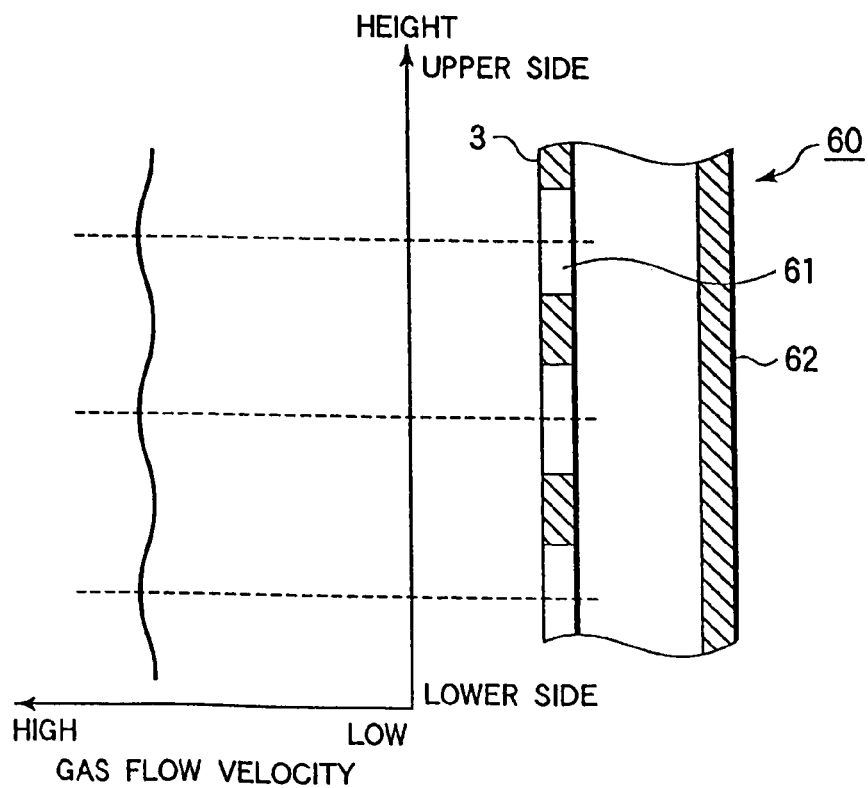

In this manner, the pressure gradient in the gas supply duct 60 decreases. Thus, the distribution of the concentration (flow velocity) of the process gases supplied into the reaction tube 3 becomes much more moderate, as shown in FIG. 5B. This can suppress variations in flow rate of the process gases for the respective wafers W in the reaction tube 3. In other words, the number of gas delivery holes 61 can be decreased more while suppressing the variations in flow rate of the process gases. According to this embodiment, the gas delivery holes 61 and pressure equalization hole 66 are arranged to form one column in the vertical direction. Alternatively, the gas delivery holes 61 and pressure equalization hole 66 may be arranged to form a plurality of columns, e.g., two columns, as descried above.

Third Embodiment

Figure 8:
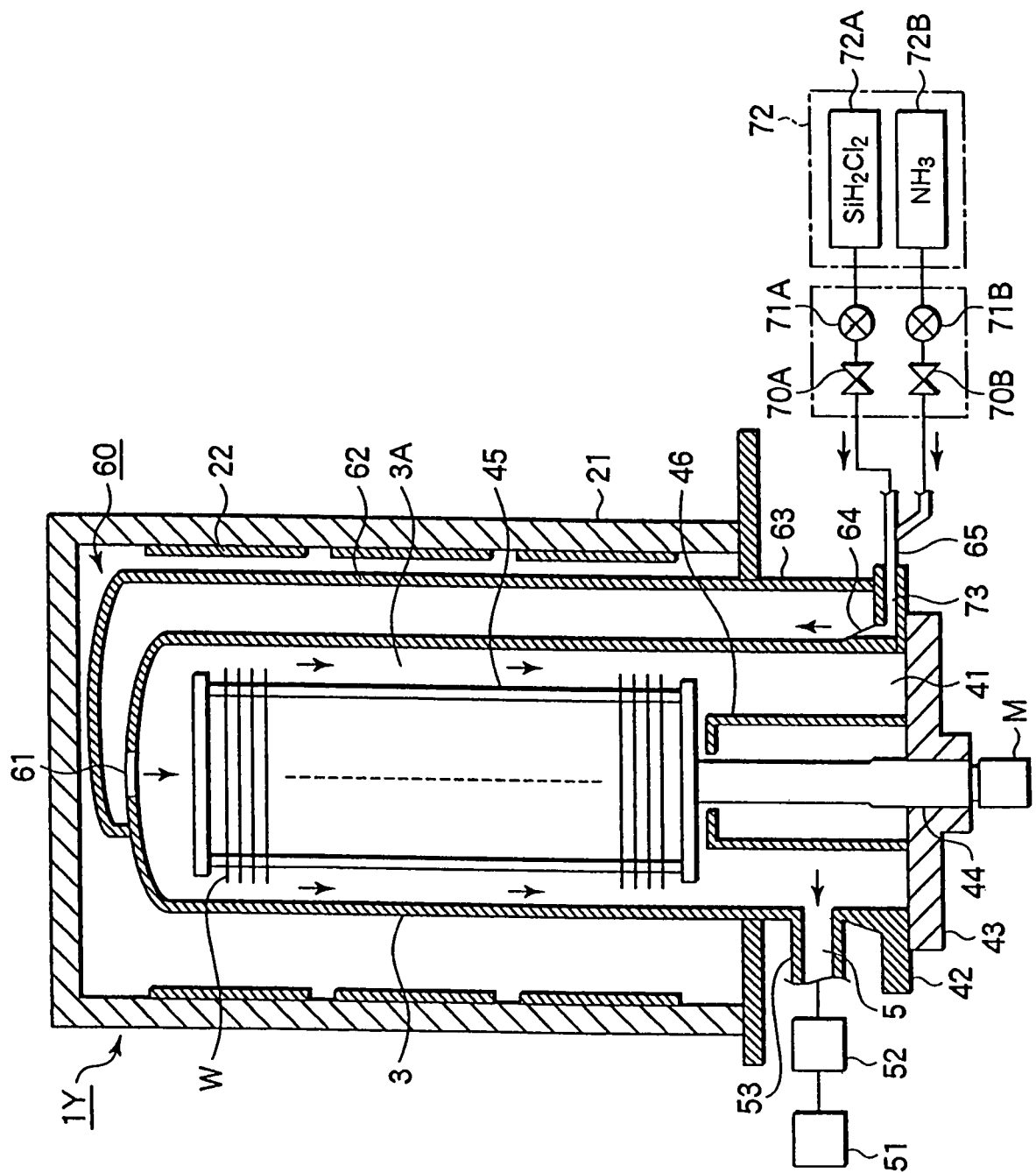
FIG. 8 is a sectional side view showing the overall arrangement of a heat processing apparatus for a semiconductor process according to the third embodiment of the present invention.
Figure 9:
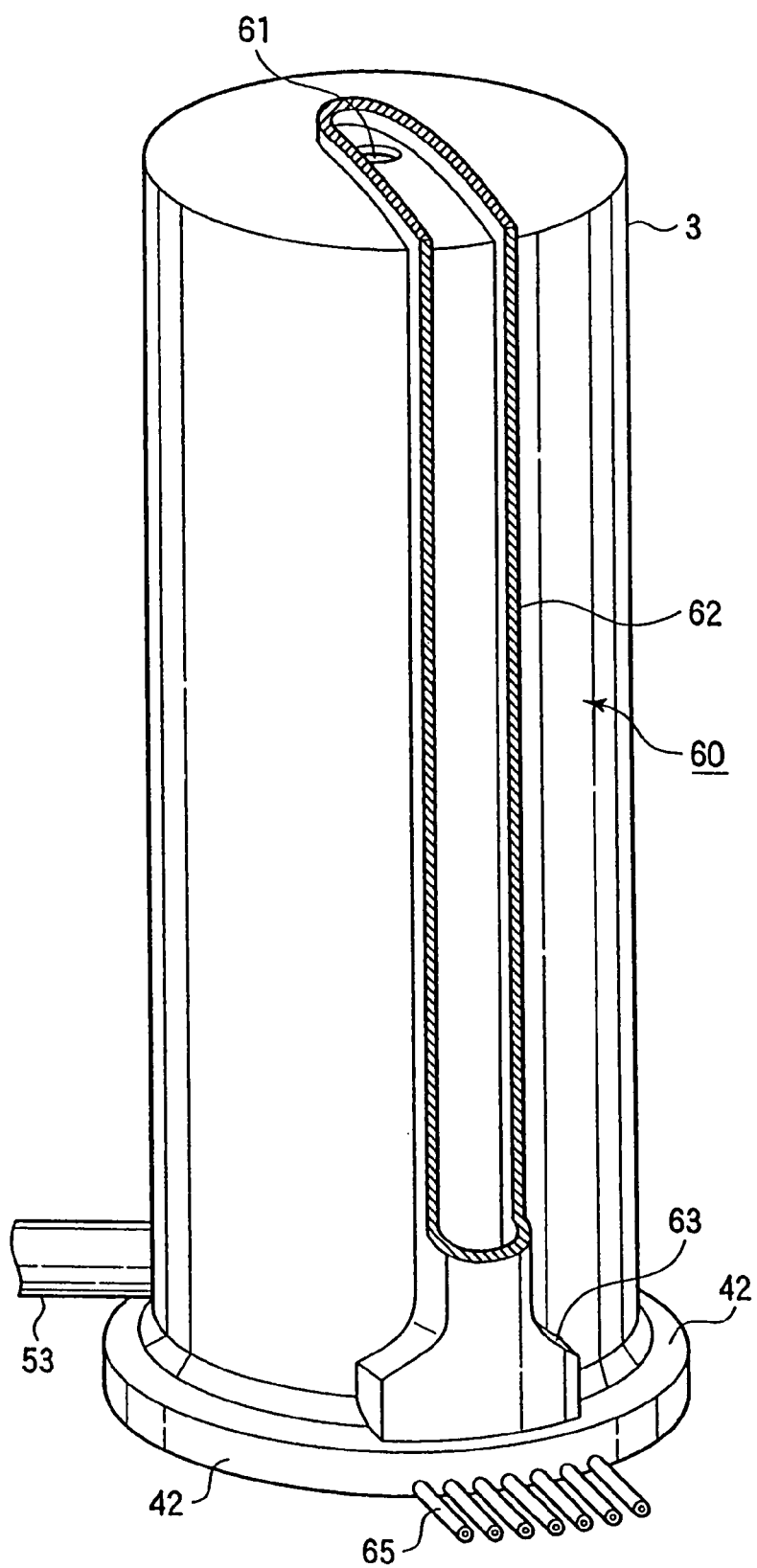
FIG. 9 is a partially cutaway perspective view showing a reaction tube and a gas supply duct in the heat processing apparatus in FIG. 8.

FIG. 8 is a sectional side view showing the overall arrangement of a heat processing apparatus for a semiconductor process according to the third embodiment of the present invention. FIG. 9 is a partially cutaway perspective view showing a reaction tube and a gas supply duct in the heat processing apparatus in FIG. 8. In this heat processing apparatus 1Y, a gas supply duct 60 extends from the bottom portion to the top portion of a reaction tube 3, as shown in FIG. 9 as well. In this case, the temperature of the lower portion of a process field 3A must be set higher than that of the upper portion by separately controlling, e.g., three heaters 22 that are divided in the vertical direction, so that a temperature gradient is formed in the process field 3A in the vertical direction. Therefore, this heat process is applied to a process in which temperature difference among wafers W does not influence the yield. An example of such a heat process includes a process of forming an $SiO_2$ film using TEOS vapor and oxygen gas.

According to this embodiment, since the gas supply duct 60 and reaction tube 3 are integrated, no gas supply pipe need be connected to the upper portion of the reaction tube 3. This facilitates installation and maintenance. In this embodiment, a gas delivery hole 61 is formed at one portion in the top portion of the reaction tube 3. Alternatively, gas delivery holes 61 may be formed at a plurality of portions, e.g., three portions, at the top. The gas delivery hole 61 may be formed in the side wall of the reaction tube 3, above the process field 3A for the wafers W.

Fourth Embodiment

Figure 10:
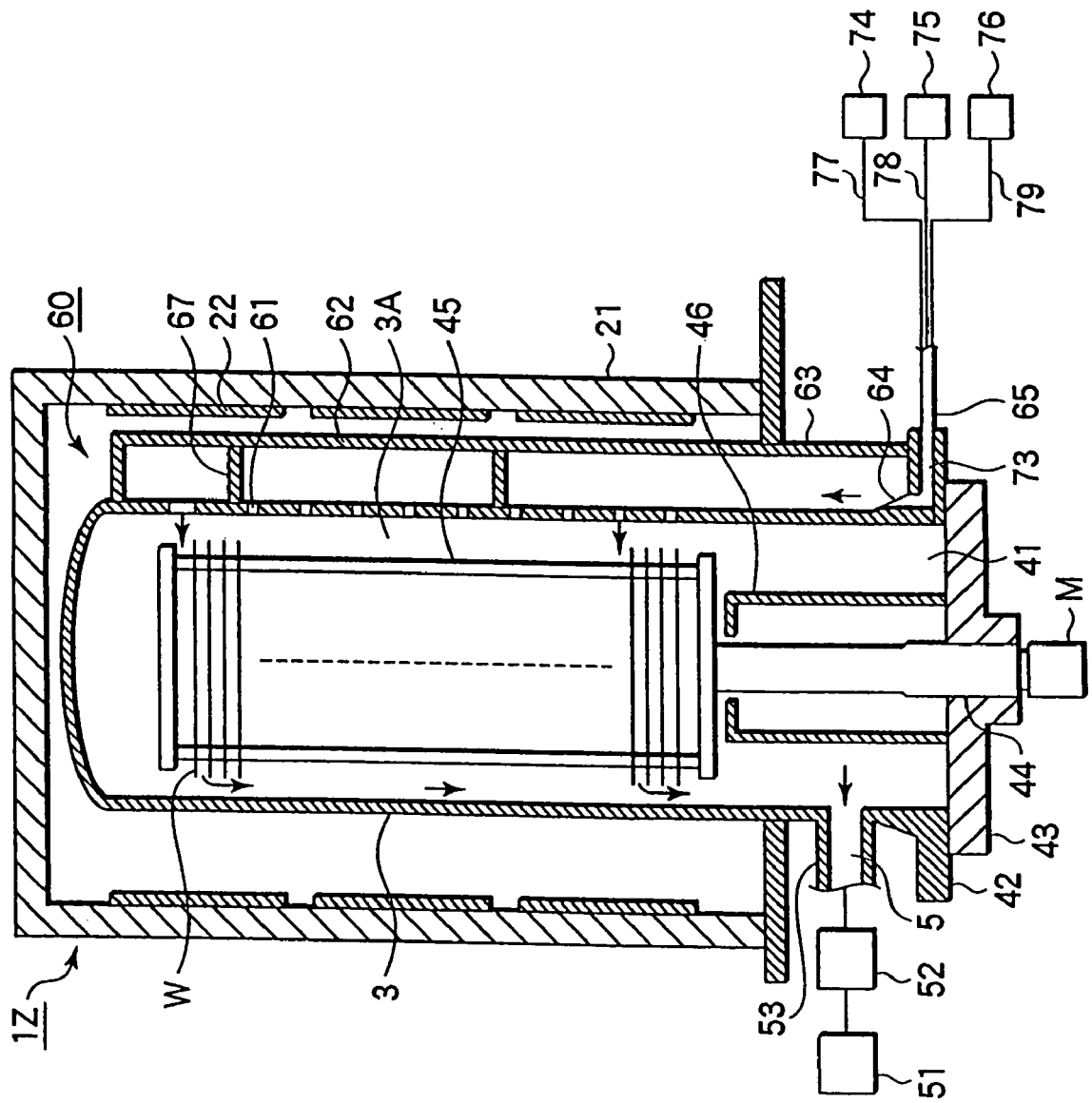
FIG. 10 is a sectional side view showing the overall arrangement of a heat processing apparatus for a semiconductor process according to the fourth embodiment of the present invention.
Figure 11:
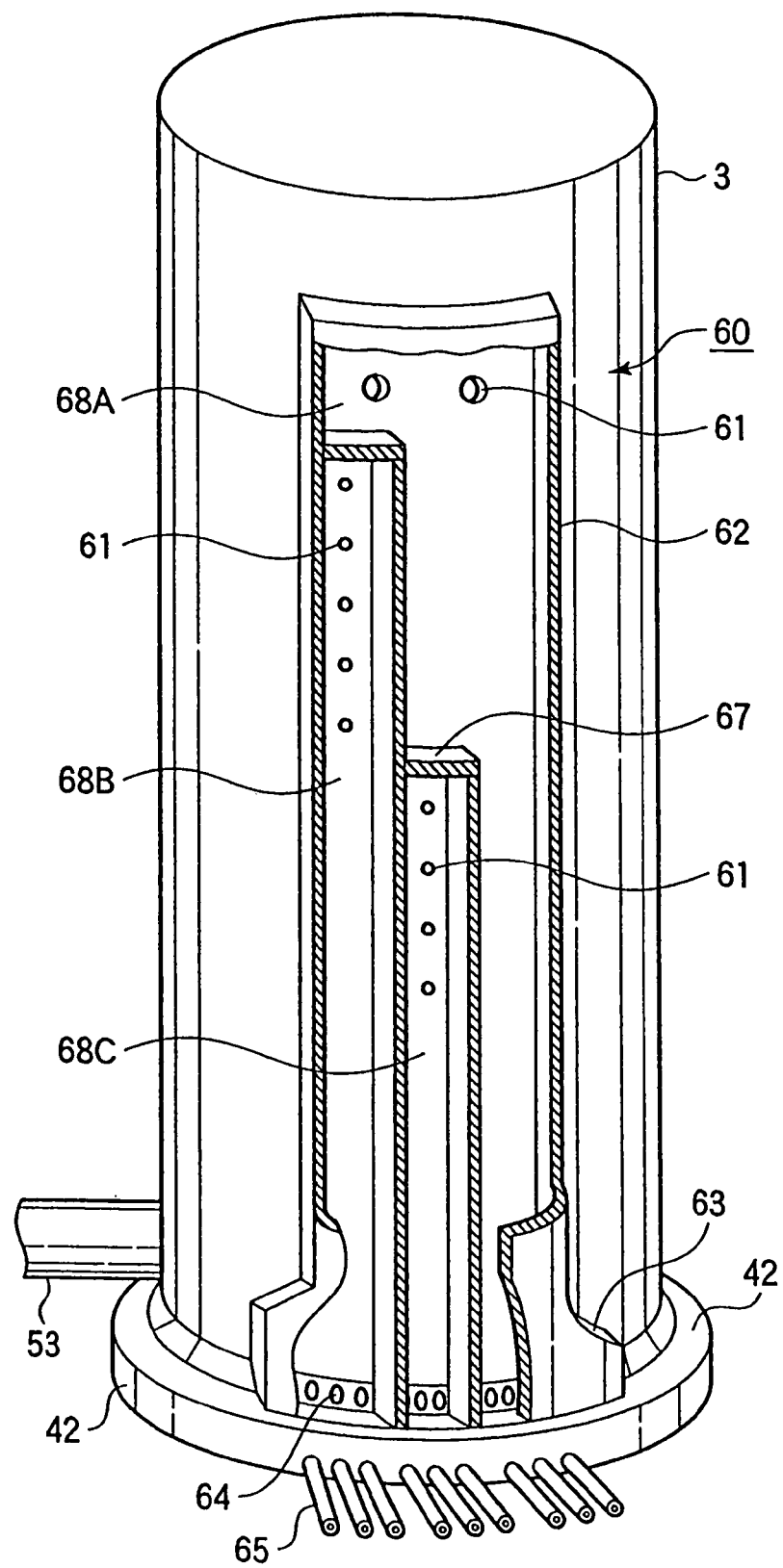
FIG. 11 is a partially cutaway perspective view showing a reaction tube and a gas supply duct in the heat processing apparatus in FIG. 10.
Figure 12:
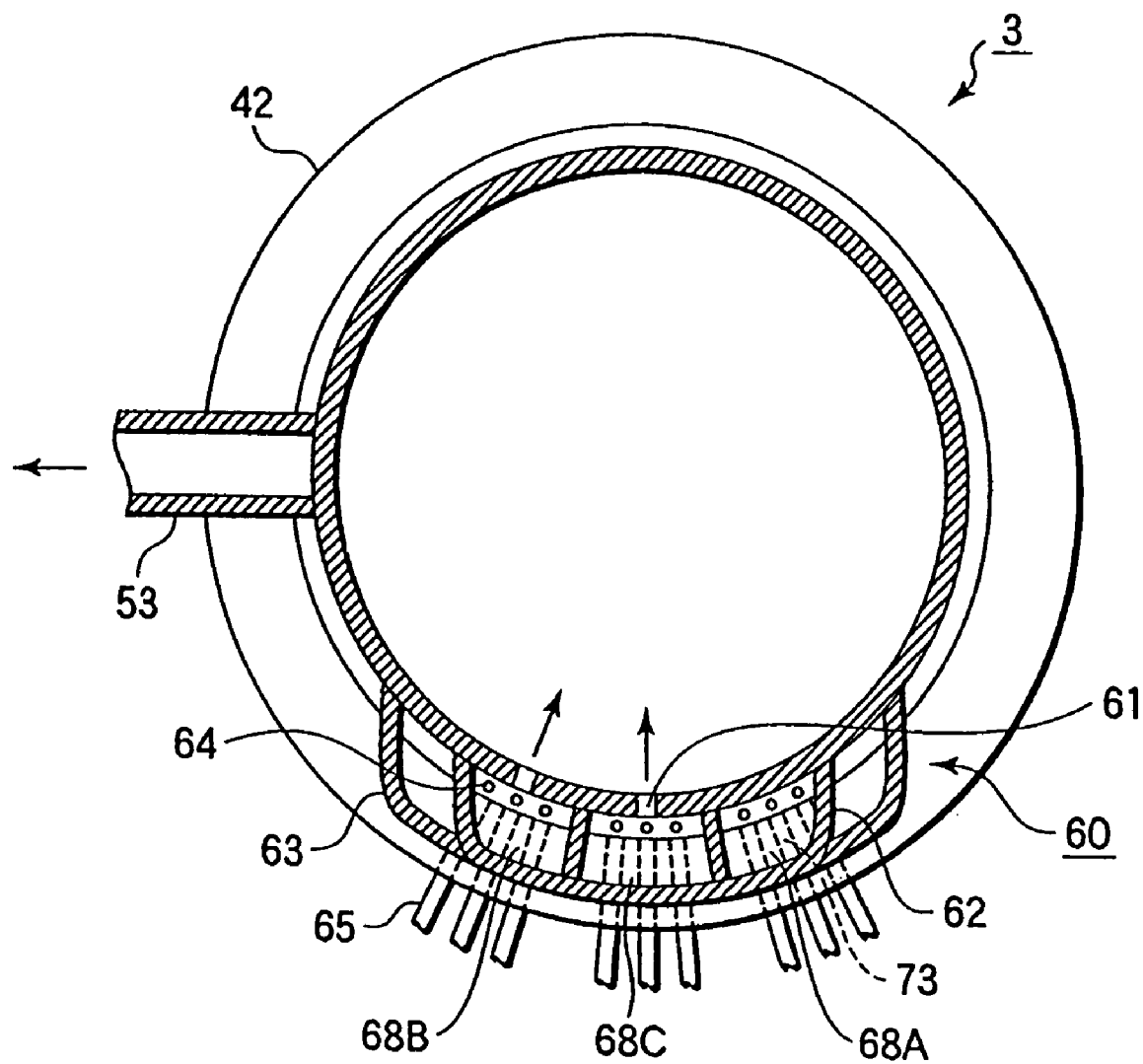
FIG. 12 is a sectional plan view showing the reaction tube and gas supply duct in the heat processing apparatus in FIG. 10.

FIG. 10 is a sectional side view showing the overall arrangement of a heat processing apparatus for a semiconductor process according to the fourth embodiment of the present invention. FIG. 11 is a partially cutaway perspective view showing a reaction tube and a gas supply duct in the heat processing apparatus in FIG. 10. FIG. 12 is a sectional plan view showing the reaction tube and gas supply duct in the heat processing apparatus in FIG. 10. In this heat processing apparatus 1Z, partitions 67 extend upward from the bottom portion of a gas supply duct 60. The partitions 67 divide a gas supply duct 60 into a first duct portion 68A, a second duct portion 68B, and a third duct portion 68C. In more detail, the third duct portion 68C with a small length is formed next to the second duct portion 68B with an intermediate length. The upper side of the first duct portion 68A with a large length, which is next to the third duct portion 68C, extends above the second duct portion 68B and third duct portion 68C.

Two gas delivery holes 61 each with a diameter of, e.g., 20 mm, are formed in the upper portion of the first duct portion 68A in the circumferential direction. A plurality of vertically arrayed gas delivery holes 61, each having a diameter of, e.g., 10 mm, are formed in the upper portion of each of the second duct portion 68B and third duct portion 68C. Namely, the positions of the gas delivery holes 61 in the longitudinal direction of a reaction tube 3 are different among the respective duct portions 68A to 68C. Process gases are supplied from the respective duct portions 68A to 68C to the respective zones on the upper, middle, and lower levels which are obtained by dividing a process field 3A in the reaction tube 3 into three in the longitudinal direction. In other words, the groups of the gas delivery holes 61 of the respective duct portions 68A to 68C are arranged to correspond to the respective ones of the three zones of the process field 3A which are separately temperature-controlled by three heaters 22.

Figure 13:
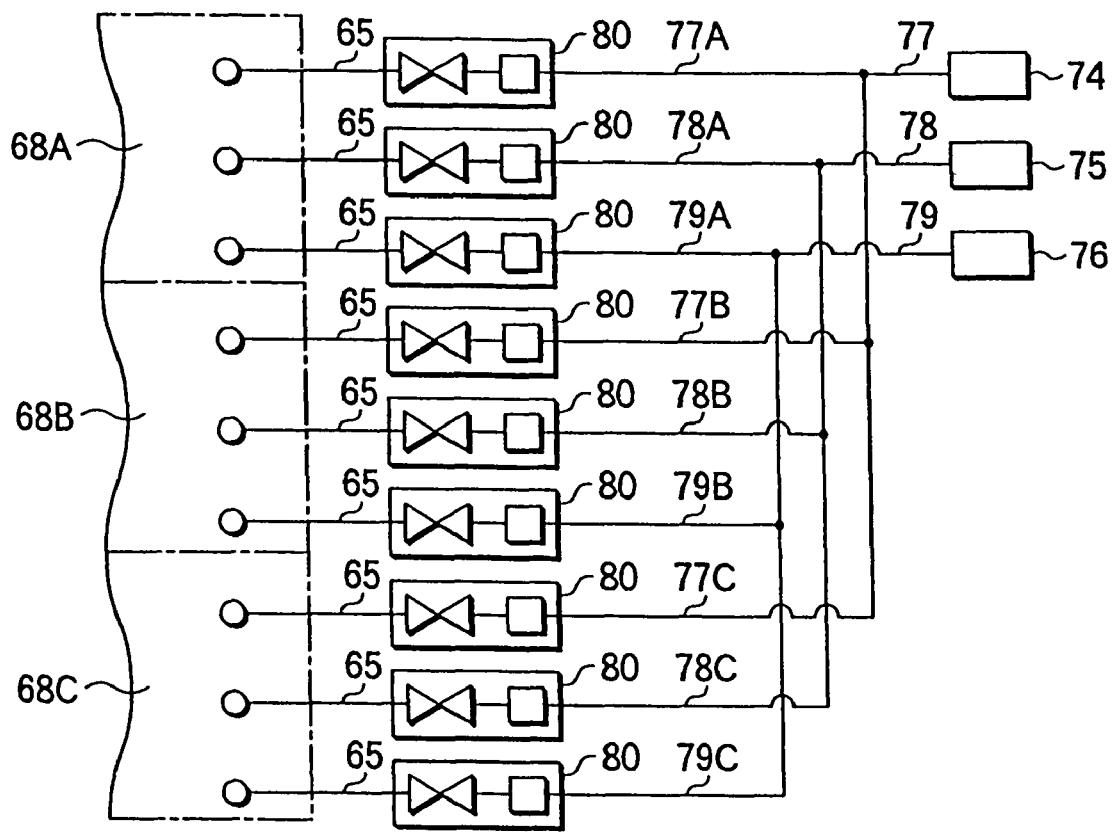
FIG. 13 is an explanatory view showing branch paths for process gases in the heat processing apparatus in FIG. 10.

FIG. 13 is a view showing branch paths for the process gases in the heat processing apparatus 1Z. Process gases are supplied to the respective duct portions 68A to 68C independently of each other. As an example, FIG. 13 shows a case in which three gas line systems are distributed to the respective duct portions 68A to 68C. As shown in FIG. 13, gas supply channels 77, 78, and 79 extend respectively from three gas supply sources 74, 75, and 76. Each of the gas supply channels 77, 78, and 79 is branched into three. Respective branch paths (77A to 77C, 78A to 78C, and 79A to 79C) are connected to gas introduction ports 64 through gas supply control units 80 each including a valve, a flow controller, and the like.

In this embodiment, the interior of the gas supply duct 60 is divided into three duct portions 68A to 68B. The groups of the gas delivery holes 61 of the three duct portions 68A to 68B respectively correspond to the vertically divided zones of the process field 3A. The flow rates of the process gases to be supplied to the respective duct portions 68A to 68C can be controlled independently of each other. Therefore, according to this embodiment, in addition to the effect of the first embodiment, an effect is obtained that the flexibility in adjustment of the flow rate of the process gases in the reaction tube 3 in the longitudinal direction (vertical direction) increase. Hence, the concentration distributions of the process gases can be uniformed easily. This provides a structure effective in uniforming the process within the surfaces of wafers W. The interior of the gas supply duct 60 may be divided into two or four or more.

The heat processing apparatus 1Z can also be applied to a heat process of supplying process gases to a process field for wafers W from above, in the same manner as in the third embodiment. In this case, for example, a dummy wafer or the like may be held on the upper side of a wafer boat 45, at a position blown by the process gases supplied from the gas delivery holes 61 in the first duct portion 68A. Namely, the position in the reaction tube 3 where the process gases are supplied from the gas delivery holes 61 in the first duct portion 68A is set above the process field 3A. In this scheme, the process gases are not supplied to the second duct portion 68B or third duct portion 68C. Hence, the fourth embodiment is also advantages in that it is provided with two process gas supply modes.

<Common Matters to First to Fourth Embodiments>

According to the above embodiments, the gas supply duct is integrally formed on the side wall of the reaction tube along the outer surface of the side wall, and the gas delivery opening which communicates with the gas supply duct is formed in the wall of the reaction tube. The gap between the inner wall of the reaction tube and the target substrates can thus be decreased. This can contribute to the improvement in planar uniformity of the heat process for the target substrates, e.g., the film thickness, the dose of an n- or p-type impurity, or the like. As the gas supply duct is disposed outside the reaction tube, the capacity of the gas supply duct does not influence the gap between the inner wall of the reaction tube and the target substrates. Hence, the capacity of the gas supply duct can be increased, and the gas pressure in the gas supply duct can be decreased. In this case, the hole diameters of the gas delivery holes can be increased while ensuring a uniform flow velocity distribution among the respective gas delivery holes. As a result, even if some reaction product formed of a component of a process gas is attached to the gas delivery holes, it hardly influences the flow rate of the process gases, unlike in the conventional case of the injector. Therefore, the gases can be supplied in a stable flow rate over a long period of time.

Furthermore, as the gas supply duct is integrally formed on the outer surface of the side wall of the reaction tube, when installing the reaction tube, the gas supply duct is also installed. Therefore, the operation of attaching or removing the gas supply duct to or from the reaction tube becomes unnecessary. This facilitates installation and maintenance of the apparatus.

The above embodiments show a process of forming an SiN film as a heat process. Alternatively, the present invention can be applied to another film formation process such as deposition of a polysilicon film, an amorphous silicon film, an $SiO_2$ film, or the like. Furthermore, the present invention can also be applied to another heat process such as oxidation, diffusion, modification, and annealing. The target substrate can be one other than a semiconductor wafer, e.g., a glass substrate, an LCD substrate, or a ceramic substrate.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A heat processing film formation apparatus for a semiconductor process, comprising:

a reaction tube of a single structure including a process field configured to store a plurality of target substrates stacked at intervals and further including a transfer port at a bottom position, the reaction tube being defined by a wall made of a heat resistant insulating material and including a flange integrally formed therewith as a portion that surrounds the transfer port;

a lid configured to engage with the flange to open and close the transfer port;

a support member configured to support the target substrates in the process field and to be loaded and unloaded to and from the reaction tube through the transfer port;

a heater configured to heat the target substrates in the process field;

a gas supply duct made of the heat resistant insulating material and connected outside to the wall of the reaction tube by welding such that part of the wall of the reaction tube serves as a wall of the gas supply duct, the gas supply duct extending upward along one side of the reaction tube from a bottom portion thereof defined by an upper surface of the flange and to a top portion thereof located at a position higher than the process field, and a portion of the gas supply duct corresponding to the process field being formed of a vertically long portion that has a horizontal width substantially smaller than that of the reaction tube;

a gas injection opening formed in the wall of the reaction tube and communicating with the gas supply duct;

a gas flow channel formed in the flange and connected to the gas supply duct, the gas flow channel communicating with the process field only through the gas supply duct and the gas injection opening;

a gas supply system connected to the gas flow channel and configured to supply a process gas for forming a film on the target substrates, so as to supply the process gas from the gas supply system into the reaction tube through the gas flow channel, the gas supply duct, and the gas injection opening in this order; and an exhaust system configured to exhaust an interior of the process field and including an exhaust port that is formed in the wall of the reaction tube at a position opposite to the gas supply duct and opened to a lower area inside the reaction tube between the process field and the transfer port, such that a gas is caused to flow downward from the process field by the exhaust system, wherein the gas supply duct includes a manifold portion disposed on the flange and the vertically long portion extending upward from the manifold portion, the manifold portion having a width larger than that of the vertically long portion, the gas flow channel includes a plurality of gas flow channels corresponding to different process gases and connected to the manifold portion, and the gas supply system includes gas supply pipes connected to a peripheral outer end of the flange at positions below the manifold portion and communicating with the manifold portion through the gas flow channels, and wherein the gas injection opening includes a plurality of gas delivery holes formed in a side portion of the wall of the reaction tube and arrayed along the gas supply duct in a range covering the process field and a pressure equalization hole formed in the side portion of the wall of the reaction tube above the gas delivery holes, the process field, and the support member, the pressure equalization hole including an opening area larger than that of each of the gas delivery holes; and the gas delivery holes and the pressure equalization hole are arranged such that the gas delivery holes laterally inject a first part of the process gas toward the target substrates supported on the support member in the process field to effect film formation on the target substrates, while the pressure equalization hole laterally injects a second part of the process gas toward a position above the process field and the support member so as not to effect the film formation on the target substrates, such that the second part flows above the process field and the support member, then flows downward and merges with the first part around the support member, and is then exhausted from the exhaust port together with the first part.

2. The apparatus according to claim 1, wherein the heat resistant insulating material comprises quartz.

3. The apparatus according to claim 1, wherein each of the gas flow channels is connected to the gas supply system at the peripheral outer end of the flange, and is bent upward in the flange and opened to the gas supply duct at the upper surface of the flange.

4. The apparatus according to claim 3, wherein each of the gas flow channels is opened to the gas supply duct at a thick root portion of the flange connected to the wall of the reaction tube.

5. The apparatus according to claim 1, wherein said plurality of gas flow channels are arrayed in an annular direction in the flange.

6. The apparatus according to claim 1, wherein the gas delivery holes are formed such that those on an upper side of the side portion of the wall have larger diameters.

7. The apparatus according to claim 1, wherein the gas delivery holes and the pressure equalization hole are arrayed in a vertical direction.

* * * * *